(12) United States Patent
Lu et al.

(10) Patent No.: US 12,557,479 B2
(45) Date of Patent: Feb. 17, 2026

(54) DISPLAY SUBSTRATE INCLUDING A PARTITION STRUCTURE LOCATED IN THE BEZEL REGION AND DISPLAY DEVICE HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hui Lu, Beijing (CN); Hongting Lu, Beijing (CN); Yunpeng Zhang, Beijing (CN); Ling Shi, Beijing (CN); Changchang Liu, Beijing (CN)

(73) Assignees: CCHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 413 days.

(21) Appl. No.: 18/022,897

(22) PCT Filed: May 31, 2022

(86) PCT No.: PCT/CN2022/096164
§ 371 (c)(1),
(2) Date: Feb. 23, 2023

(87) PCT Pub. No.: WO2023/230816
PCT Pub. Date: Dec. 7, 2023

(65) Prior Publication Data
US 2024/0276774 A1    Aug. 15, 2024

(51) Int. Cl.
*H10K 59/12*    (2023.01)
*H10K 59/122*    (2023.01)
*H10K 59/80*    (2023.01)

(52) U.S. Cl.
CPC ........ *H10K 59/122* (2023.02); *H10K 59/873* (2023.02)

(58) Field of Classification Search
CPC .......................... H10K 59/122; H10K 59/873
USPC ........................................................... 257/91
See application file for complete search history.

(56) References Cited

U.S. PATENT DOCUMENTS

2016/0141545 A1    5/2016    Kim
2019/0363146 A1*   11/2019   Takahashi ............ H10K 59/873
2022/0190292 A1    6/2022    Gong et al.
(Continued)

FOREIGN PATENT DOCUMENTS

CN    105789251 A      7/2016
CN    112582569 A  *   3/2021    ......... H10K 59/8723
CN    11336306 A       9/2021
(Continued)

*Primary Examiner* — Phuc T Dang
(74) *Attorney, Agent, or Firm* — WHDA, LLP

(57) ABSTRACT

This disclosure provides a display substrate and a display device. The display substrate includes: a display region and a bezel region adjacent to the display region; the display substrate further includes: a partition structure and a cathode layer, the partition structure is located in the bezel region; the cathode layer includes a portion located in the display region and a portion located in the bezel region, and the cathode layer is partitioned by the partition structure.

19 Claims, 9 Drawing Sheets

(56) References Cited

U.S. PATENT DOCUMENTS

2022/0199736 A1   6/2022  Wang et al.

FOREIGN PATENT DOCUMENTS

| CN | 113363306 A | 9/2021 | |
|----|----|----|----|
| WO | WO-2021092975 A1 * | 5/2021 | ........... H10K 50/844 |
| WO | 2021/253345 A1 | 12/2021 | |

* cited by examiner

DISPLAY SUBSTRATE INCLUDING A PARTITION STRUCTURE LOCATED IN THE BEZEL REGION AND DISPLAY DEVICE HAVING THE SAME

CROSS-REFERENCE TO RELATED APPLICATIONS

This application is the U.S. national phase of PCT Application No. PCT/CN2022/096164 filed on May 31, 2022, the disclosure of which is hereby incorporated by reference in its entirety.

TECHNICAL FIELD

The present disclosure relates to the technical field of display, and particularly to a display substrate and a display device.

BACKGROUND

With the continuous application of information technology, video conferencing, video monitoring, multimedia teaching and other fields have continuously elevated requirements on display performance and display size of the display terminals. Ordinary display products cannot meet the diversified display requirements; while because spliced large-screen products can be spliced into any size and their display can be flexibly performed and controlled, they are more suitable for applications in different industries and different fields, and are adopted by numerous industry clients and integrators.

SUMMARY

It is an object of the present disclosure to provide a display substrate and a display device.

To achieve the above-mentioned object, the present disclosure provides the following technical solutions.

The present disclosure provides, in a first aspect, a display substrate including a display region and a bezel region adjacent to the display region: further including:
 a partition structure, wherein the partition structure is located in the bezel region; the partition structure includes multiple partition pillars, the multiple partition pillars include first-part partition pillars and second-part partition pillars, the first-part partition pillars are located between the display region and the second-part partition pillars; in a direction perpendicular to a base substrate of the display substrate, a distance between each of the second-part partition pillars and a surface of the base substrate is less than a distance between each of the first-part partition pillars and the surface of the base substrate; and
 a cathode layer, wherein the cathode layer includes a portion located in the display region and a portion located in the bezel region, and the cathode layer is partitioned by the partition structure.

Optionally, the partition pillars have a notch on a side.

Optionally, the display substrate includes a second planarization layer and a second passivation layer which are arranged in a stack, and the second planarization layer is located between the base substrate of the display substrate and the second passivation layer; and the partition pillars are made of the second planarization layer.

Optionally, the display substrate further includes: a first planarization layer and a first passivation layer, wherein the first passivation layer is located between the second planarization layer and the base substrate, and the first planarization layer is located between the first passivation layer and the second planarization layer; and
 the first-part partition pillars are located on a surface of the first planarization layer facing away from the base substrate, and the second-part partition pillars are located on a surface of the first passivation layer facing away from the base substrate.

Optionally, a distance between the adjacent partition pillars in the second-part partition pillars gradually increases, or firstly increases and then decreases along a direction away from the display region.

Optionally, a quantity of the partition pillars making up the second-part partition pillars is greater than a quantity of the partition pillars making up the first-part partition pillars.

Optionally, the display substrate further includes:
 a first planarization layer, wherein the first planarization layer is located between the second planarization layer and the base substrate; and
 at least one separation groove located in the bezel region, wherein the separation groove penetrates the first planarization layer and the second planarization layer.

Optionally, the display substrate includes a first separation groove and a second separation groove, and the first separation groove and the second separation groove are sequentially arranged along a direction away from the display region; a width of the first separation groove is less than a width of the second separation groove.

Optionally, the first separation groove, the first-part partition pillars, the second separation groove, and the second-part partition pillars are sequentially arranged along a direction away from the display region.

Optionally, a minimum distance between the second-part partition pillars and the second separation groove is greater than a minimum distance between the first-part partition pillars and the first separation groove.

Optionally, the display substrate further includes:
 a dam structure, wherein an orthographic projection of the at least one separation groove onto the base substrate is located between an orthographic projection of the dam structure onto the base substrate and the display region.

Optionally, the display substrate further includes:
 a light-emitting functional layer, wherein the light-emitting functional layer includes a portion located in the display region and a portion located in the bezel region, and the light-emitting functional layer is partitioned by the partition structure.

Optionally, the partition structure surrounds the display region.

Optionally, the separation groove surrounds the display region.

Optionally, the display substrate further includes:
 multiple sub-pixels, wherein the multiple sub-pixels are located in the display region, and the sub-pixels each include a sub-pixel driving circuit and an anode pattern which are coupled to each other; and
 multiple gate driving circuits, wherein the gate driving circuits each are coupled to a corresponding sub-pixel driving circuit for providing a scanning signal to the corresponding sub-pixel driving circuit, and an orthographic projection of the gate driving circuit onto the base substrate of the display substrate at least partially overlaps with an orthographic projection of the anode pattern onto the base substrate.

Optionally, the sub-pixel driving circuits included by the multiple sub-pixels are distributed in an array, the sub-pixel driving circuits are divided into multiple columns of the sub-pixel driving circuits, the multiple columns being arranged along a first direction, each column of the sub-pixel driving circuits includes multiple sub-pixel driving circuits arranged along a second direction, and the first direction intersects with the second direction;

the multiple gate driving circuits include: multiple light-emitting control driving circuits and multiple scanning control driving circuits; and on a same side of the display substrate, the light-emitting control driving circuits alternate with the scanning control driving circuits along the second direction.

Optionally, the display region includes a first sub-display area and a second sub-display area, and the gate driving circuits are located in the second sub-display area; and a distance between at least two adjacent columns of sub-pixel driving circuits in the second sub-display area is less than a distance between two adjacent columns of sub-pixel driving circuits in the first sub-display area.

Optionally, the second sub-display area includes three columns of sub-pixel driving circuits, and a distance between any two adjacent columns of the sub-pixel driving circuits in the second sub-display area is less than a distance between any two adjacent columns of the sub-pixel driving circuits in the first sub-display area.

Optionally, along the first direction, a width of the second sub-display area is substantially the same as a width of a layout region occupied by a repeating unit in the first sub-display area, and the repeating unit includes three adjacent columns of sub-pixel driving circuits, and signal lines located on both sides of the three adjacent columns of sub-pixel driving circuits along the first direction.

Optionally, at least some of widths of layout spaces occupied in the first direction by the sub-pixel driving circuits located in the second sub-display area are less than widths of layout spaces occupied in the first direction by the sub-pixel driving circuits located in the first sub-display area.

Based on the above-mentioned technical solutions of the display substrate, the present disclosure provides, in a second aspect, a display device including the above-mentioned display substrate.

BRIEF DESCRIPTION OF THE DRAWINGS

The drawings described herein are used to provide a further understanding of the disclosure and constitute a part of this disclosure. Illustrative embodiments of the disclosure and the description thereof are used to explain the disclosure and do not constitute an undue limitation on the disclosure. In the drawings.

DETAILED DESCRIPTION

To further explain a display substrate and a display device provided by the embodiments of the present disclosure, a detailed description will be provided with reference to the accompanying drawings.

Many of the spliced screens on the market are digital light processing (DLP) screens, light-emitting diode (LED) screens, or liquid crystal display (LCD) screens. Spliced organic light-emitting diode (OLED) screens are rare. OLED screens are capable of displaying more colors, and spliced screens made of OLED screens can better exploit this advantage. However, when the OLED screens are formed into a spliced screen, since the bezel width of the OLED screen is wide, a relatively wide splicing seam will result, affecting the user experience.

Figure 1:
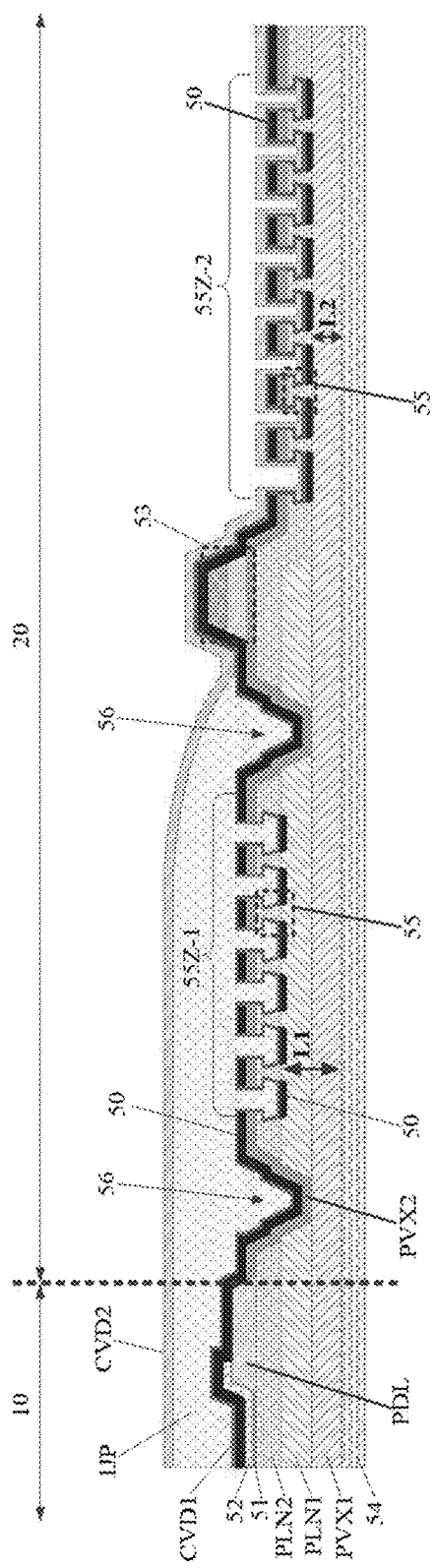
FIG. 1 is a schematic diagram of a partition structure in a bezel region of a display substrate according to an embodiment of the present disclosure.
Figure 2:
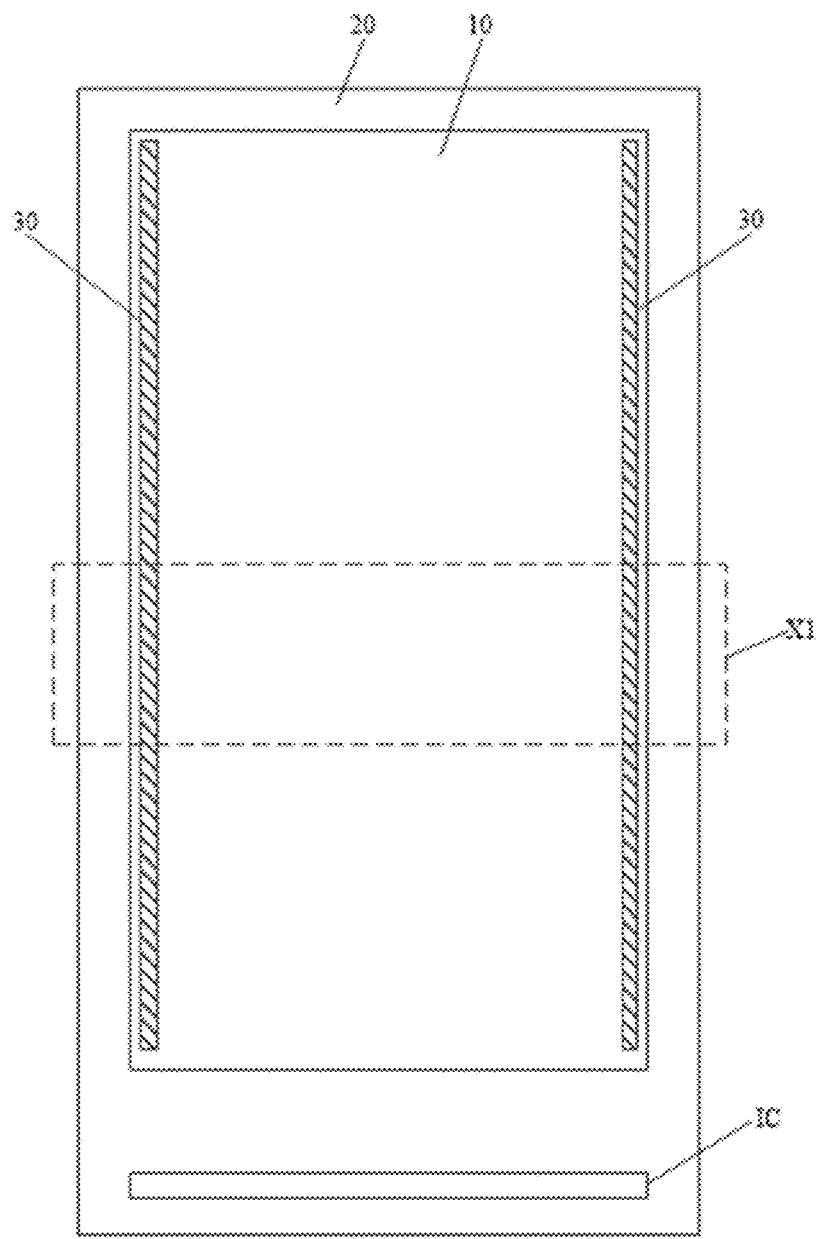
FIG. 2 is a schematic structural diagram of a display substrate according to an embodiment of the present disclosure.

With reference to FIGS. 1 and 2, embodiments of the present disclosure provide a display substrate including: a display region 10 and a bezel region 20 adjacent to the display region 10, for example: a bezel region 20 located around the display region 10. The display substrate further includes:

a partition structure, wherein the partition structure is located in the bezel region 20; the partition structure includes multiple partition pillars 55, the multiple partition pillars 55 include first-part partition pillars 55Z-1 and second-part partition pillars 55Z-2, the first-part partition pillars 55Z-1 are located between the display region 10 and the second-part partition pillars 55Z-2; in a direction perpendicular to a base substrate 54 of the display substrate, a distance L2 between each of the second-part partition pillars 55Z-2 and a surface of the base substrate 54 is less than a distance L1 between each of the first-part partition pillars 55Z-1 and the surface of the base substrate 54; a distance between each of the second-part partition pillars and a surface of the base substrate is less than a distance between each of the first-part partition pillars and the surface of the base substrate.

Illustratively, in a direction perpendicular to a base substrate of the display substrate, a height of the second part partition pillars 55Z-2 relative to the surface of the base substrate is less than a height of the first-part partition pillars 55Z-1 relative to the surface of the base substrate.

The display substrate further includes a cathode layer 50, wherein the cathode layer 50 includes a portion located in the display region 10 and a portion located in the bezel region 20, and the cathode layer 50 is partitioned by the partition structure.

It is noted that a driving chip integrated circuit (IC) is also shown in FIG. 2.

Illustratively, the display substrate is applied in an OLED screen. The display substrate further includes a pixel driving circuit structure, an anode layer 51, a light-emitting functional layer, and a cathode layer 50 which are sequentially arranged on the base substrate 54 along a direction away from the base substrate 54 of the display substrate. The pixel driving circuit provides a driving signal to the anode layer 51, and the light-emitting functional layer emits light under the combined influence of the anode layer 51 and the cathode layer 50, thereby realizing the display function of the display substrate.

Illustratively, the bezel region 20 surrounds the display region 10.

Illustratively, the partition structure surrounds the display region 10; or the partition structure is located in the bezel region 20 and is close to at least one side of the display region 10.

Illustratively, the cathode layer 50 is made of an electrically conductive metal material, and the portion of the cathode layer 50 located in the bezel region 20 can be partitioned by the partition structure. It is to be noted that the cathode layer 50 can be naturally broken at the side of the partition structure without requiring an additional process.

In the related art, when the cathode layer 50 is formed, the cathode layer 50 with a sufficient width is reserved in the bezel region 20, so that the yield of the cathode layer 50 can be ensured when the cathode layer 50 is subjected to a patterning process. To reserve the cathode layer 50 with the sufficient width requires a wider bezel width, which goes against the trend of narrowing the bezel of display substrate. It should be noted that the cathode layer 50 herein refers to a metal conductive layer which is located on a side of the light-emitting functional layer facing away from the base substrate, and can extend from the display region to the bezel region.

According to the above-mentioned specific structure of the display substrate, it can be seen that in the display substrate according to an embodiment of the present disclosure, the partition structure is provided in the bezel region 20, so that the cathode layer 50 can be naturally broken at the position where the partition structure is located, thereby avoiding performing a patterning process on the cathode layer 50. Therefore, it is not necessary to reserve a cathode layer 50 with a sufficient width in the bezel region 20, and the fabrication yield of the cathode layer 50 can still be ensured.

Therefore, in the display substrate according to an embodiment of the present disclosure, it is not necessary to reserve a cathode layer 50 with a sufficient width in the bezel region 20, and accordingly the bezel width of the display substrate can be effectively narrowed, which facilitates the narrowing of the bezel of the display substrate. In this way, when the display substrate is applied to an OLED spliced screen, the splicing seam can be effectively reduced and the user experience can be improved. When the display substrate is applied to the OLED spliced screen, the splicing seam can be reduced to 1 mm.

In the display substrate according to an embodiment of the present disclosure, the partition structure includes multiple partition pillars 55, the multiple partition pillars 55 include first-part partition pillars 55Z-1 and second-part partition pillars 55Z-2, and the first-part partition pillars 55Z-1 are located between the display region 10 and the second-part partition pillars 55Z-2, therefore, better partition of the cathode layer 50 by the partition structure is ensured.

In the display substrate according to an embodiment of the present disclosure, in a direction perpendicular to the base substrate of the display substrate, the distance between each of the second-part partition pillars and the surface of the base substrate is less than the distance between each of the first-part partition pillars and the surface of the base substrate, therefore, the edge of the display substrate is prevented from buckling upward due to too high partition pillars.

Illustratively, in the display substrate according to an embodiment of the present disclosure, in a direction perpendicular to the base substrate of the display substrate, the height of the second-part partition pillars 55Z-2 relative to the surface of the base substrate is less than the height of the first-part partition pillars 55Z-1 relative the surface of the base substrate, therefore, the edge of the display substrate is prevented from buckling upward due to too high partition pillars.

As shown in FIG. 1, in some embodiments, the partition structure includes at least one partition pillar 55 having a notch on a side of the partition pillar 55.

Illustratively, during a deposition process to form the cathode layer 50, the cathode layer 50 can be naturally broken at the notch on the side of the partition pillar 55, thereby the portion of the cathode layer 50 close to the display region 10 and the portion of the cathode layer 50 close to a boundary of the display substrate can be naturally partitioned.

As shown in FIG. 1, in some embodiments, the display substrate includes a second planarization layer PLN2 and a second passivation layer PVX2 which are arranged in a stack. The second planarization layer PLN2 is located between the base substrate 54 of the display substrate and the second passivation layer PVX2. The partition pillars 55 are at the second planarization layer PLN2.

Illustratively, the display substrate includes a first passivation layer PVX1, a first planarization layer PLN1, a second planarization layer PLN2, a second passivation layer PVX2, an anode layer 51, a pixel definition layer PDL, a spacer, a light-emitting functional layer, a cathode layer 50, a first inorganic encapsulation layer CVD1, an organic encapsulation layer IJP, and a second inorganic encapsulation layer CVD2 which are sequentially formed on the base substrate 54 along a direction away from the base substrate 54.

Illustratively, the partition pillars 55 are made of the second planarization layer. More specifically, after the second passivation layer is formed, the second planarization layer is subjected to a dry etching process using the second passivation layer as a mask, to form the partition pillars 55.

As shown in FIG. 1, in some embodiments, the display substrate further includes: a first planarization layer PLN1 and a first passivation layer PVX1. The first passivation layer PVX1 is located between the second planarization layer PLN2 and the base substrate 54, and the first planarization layer PLN1 is located between the first passivation layer PVX1 and the second planarization layer PLN2.

The first-part partition pillars 55Z-1 are located on a surface of the first planarization layer PLN1 facing away from the base substrate 54, and the second-part partition pillars 55Z-2 are located on a surface of the first passivation layer PVX1 facing away from the base substrate 54.

The above-mentioned arrangement enables the second-part partition pillars 55Z-2 close to the edge of the display substrate to be formed on the surface of the first passivation layer PVX1 made of an inorganic material, such that the second-part partition pillars 55Z-2 are in better contact with the first passivation layer PVX1, which is beneficial to improving the sealability of the contact interface between the second-part partition pillars 55Z-2 and the first passivation layer PVX1, and can better prevent moisture and oxygen from invading the interior of the display substrate.

In some embodiments, a distance between adjacent partition pillars 55 in the second-part partition pillars 55Z-2 gradually increases, or firstly increases and then decreases along a direction away from the display region 10.

The greater the distance between adjacent partition pillars 55 in the vicinity of the edge of the display substrate, the greater the area available to isolation of moisture and oxygen, and the better the isolation.

In some embodiments, the quantity of the partition pillars 55 making up the second-part partition pillars 55Z-2 is greater than the quantity of the partition pillars 55 making up the first-part partition pillars 55Z-1.

The above-mentioned arrangement enables more partition pillars 55 to be provided in a region close to the edge of the display substrate, improving the effect of isolating moisture and oxygen at the edge region of the display substrate.

As shown in FIG. 1, in some embodiments, the display substrate further includes:
a first planarization layer PLN1, wherein the first planarization layer PLN1 is located between the second planarization layer PLN2 and the base substrate 54; and
at least one separation groove 56 located in the bezel region 20, wherein the separation groove 56 penetrates the first planarization layer PLN1 and the second planarization layer PLN2.

Illustratively, the separation groove 56 surrounds the display region 10. Or the separation groove 56 is located in the bezel region 20 and is close to at least one side of the display region 10.

Illustratively, the display substrate includes at least two separation grooves 56, and the at least two separation grooves 56 are sequentially nested and surround the display region 10.

Since both the first planarization layer and the second planarization layer are made of an organic material, it is easy to provide a transmission path for external moisture and oxygen to invade into the interior of the display substrate. The above-mentioned separation groove 56 is provided to penetrate the first planarization layer and the second planarization layer, so that the separation groove 56 can separate both the first planarization layer and the second planarization layer into a part close to the display region 10 and a part close to the boundary of the display substrate, thereby effectively preventing external moisture and oxygen from invading into the interior of the display substrate by using the first planarization layer and the second planarization layer as the transmission path.

In some embodiments, the display substrate is provided to include a first separation groove (e.g., a separation groove 56 on the left side in FIG. 1) and a second separation groove (e.g., a separation groove 56 on the right side in FIG. 1). The first separation groove and the second separation groove are arranged in sequence along a direction away from the display region 10. The width of the first separation groove is less than the width of the second separation groove.

The above-mentioned arrangement provides a larger area close to the edge of the display substrate for effectively isolating moisture and oxygen, resulting in a better isolation effect.

As shown in FIG. 1, in some embodiments, the first separation groove, the first-part partition pillars 55Z-1, the second separation groove, and the second-part partition pillars 55Z-2 are sequentially arranged along a direction away from the display region 10.

Illustratively, the partition structure surrounds the display region 10. The separation groove 56 surrounds the display region 10.

Illustratively, the quantity of partition pillars 55 making up the first-part partition pillars 55Z-1 is less than the quantity of partition pillars 55 making up the second-part partition pillars 55Z-2.

Illustratively, the minimum distance between adjacent partition pillars 55 in the first-part partition pillars 55Z-1 is less than the minimum distance between adjacent partition pillars 55 in the second-part partition pillars 55Z-2.

Illustratively, in the first-part partition pillars 55Z-1 and/or the second-part partition pillars 55Z-2, the maximum distance between adjacent partition pillars 55 is between 6 μm and 16 μm, and endpoint values of the range may be inclusive, but the present disclosure is not limited thereto.

Illustratively, in the first-part partition pillars 55Z-1 and/or the second-part partition pillars 55Z-2, the height of the partition pillars 55 in the direction perpendicular to the base substrate is between 1 μm and 3 μm, and endpoint values of the range may be inclusive, but the present disclosure is not limited thereto. In a direction perpendicular to the base substrate of the display substrate, the distance between each of the second-part partition pillars 55Z-2 and the surface of the base substrate is less than the distance between each of the first-part partition pillars 55Z-1 and the surface of the base substrate. For example: in a direction perpendicular to the base substrate of the display substrate, the distance between each of the second-part partition pillars 55Z-2 and the surface of the base substrate is less than the distance between each of the first-part partition pillars 55Z-1 and the surface of the base substrate by a value between 0.3 μm and 1.5 μm, and endpoint values of the range may be inclusive, but the present disclosure is not limited thereto.

Illustratively, in the first-part partition pillars 55Z-1 and/or the second-part partition pillars 55Z-2, the height of the partition pillars 55 in the direction perpendicular to the base substrate is between 1 μm and 2 μm, and endpoint values of the range may be inclusive, but the present disclosure is not limited thereto.

The above-mentioned arrangement not only partitions the cathode layer 50 in the bezel region 20, but also can better avoid the transmission of external moisture and oxygen to the interior of the display substrate along the first planarization layer and the second planarization layer. Therefore, the above-mentioned display substrate not only facilitates the narrowing of the bezel, but also improves the reliability of the display substrate in use and prolongs the service life of the display substrate.

In some embodiments, the minimum distance between the second-part partition pillars 55Z-2 and the second separation groove is greater than the minimum distance between the first-part partition pillars 55Z-1 and the first separation groove.

The above-mentioned arrangement provides a larger area close to the edge of the display substrate for effectively isolating moisture and oxygen, resulting in a better isolation effect.

As shown in FIG. 1, in some embodiments, the display substrate further includes: a dam structure 53, wherein an orthographic projection of the at least one separation groove 56 onto the base substrate 54 is located between the orthographic projection of the dam structure 53 onto the base substrate 54 and the display region 10.

Illustratively, the display substrate further includes an encapsulation layer including a first inorganic encapsulation layer CVD1, an organic encapsulation layer IJP, and a second inorganic encapsulation layer CVD2 which are sequentially arranged in a stack along a direction away from the base substrate 54. The dam structure 53 can prevent the organic encapsulation layer from overflowing to the boundary of the display substrate during a fabrication process, and prevent the organic encapsulation layer from being exposed at the boundary of the display substrate to serve as a transmission channel for external moisture and oxygen intrusion.

Illustratively, orthographic projections of all separation grooves 56 of the display substrate onto the base substrate 54 are all located between the orthographic projection of the dam structure 53 onto the base substrate 54 and the display region 10.

Illustratively, the second separation groove (e.g., separation groove 56 on the right in FIG. 1) is closer to the dam structure 53 than the first separation groove (e.g., separation groove 56 on the left in FIG. 1), and the thickness of the organic encapsulation layer IJP at the second separation groove is less than the thickness of the organic encapsulation layer IJP at the first separation groove.

The orthographic projection of the at least one separation groove 56 onto the base substrate 54 is located between the orthographic projection of the dam structure 53 onto the base substrate 54 and the display region 10, so that the organic encapsulation layer can be contained in the separation groove 56, thereby not only reducing the probability of the organic encapsulation layer overflowing to the boundary of the display substrate, but also effectively improving the reliability of the display substrate.

As shown in FIG. 1, in some embodiments, the display substrate further includes: a light-emitting functional layer, wherein the light-emitting functional layer includes a portion located in the display region 10 and a portion located in the bezel region 20, and the light-emitting functional layer is partitioned by the partition structure (e.g., the partition pillars 55).

Illustratively, the light-emitting functional layer includes an organic light-emitting material layer 52 and a common layer which are arranged in a stack, the common layer includes at least a hole injection layer, a hole transport layer, an electron transport layer, and an electron injection layer which are arranged in a stack, and the organic light-emitting material layer 52 is located between the hole transport layer and the electron transport layer. The common layer includes a portion located in the display region 10 and a portion located in the bezel region 20, and the common layer is partitioned by the partition structure (e.g., the partition pillars 55).

The light-emitting functional layer includes an organic material, which is easy to provide a path for external moisture and oxygen to invade the interior of the display substrate. The light-emitting functional layer is partitioned at a side notch of the partition structure, to prevent external moisture and oxygen from being transmitted to the interior of the display substrate with the light-emitting functional layer being used as a transmission path, thereby effectively improving the reliability of the display substrate and extending the service life of the display substrate.

Figure 3:
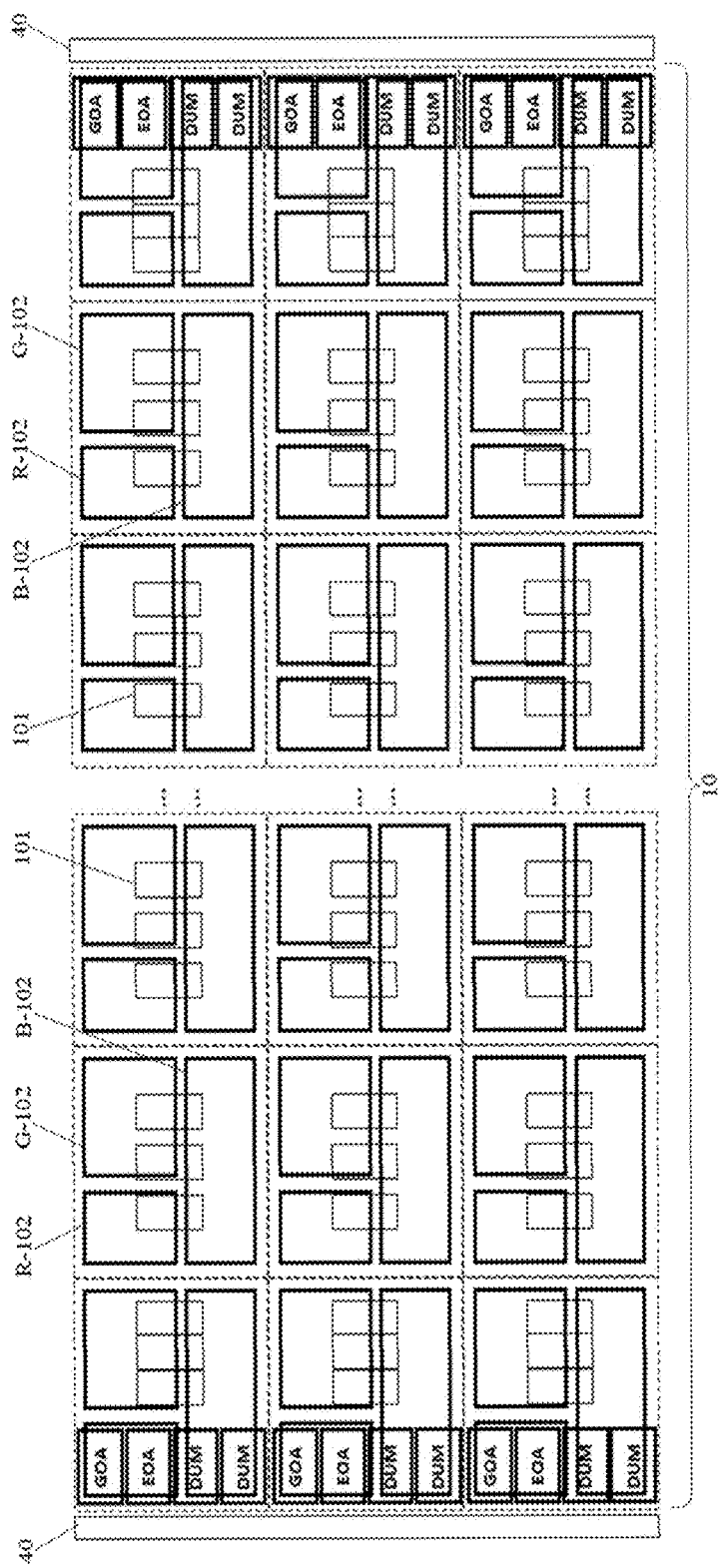
FIG. 3 is an enlarged schematic diagram of a XI portion in FIG. 2.

As shown in FIGS. 2 and 3, in some embodiments, the display substrate further includes:
multiple sub-pixels, wherein the multiple sub-pixels are located in the display region 10, and the sub-pixels each include a sub-pixel driving circuit 101 and an anode pattern (e.g., an anode pattern R-102 included by the red sub-pixel, an anode pattern B-102 included by the blue sub-pixel, and an anode pattern G-102 included by the green sub-pixel) which are coupled to each other; and multiple gate driving circuits 30 (including a light-emitting control driving circuit EOA and a scanning control driving circuit GOA), wherein the gate driving circuits 30 each are coupled to a corresponding sub-pixel driving circuit 101 for providing a scanning signal to the corresponding sub-pixel driving circuit 101, and an orthographic projection of the gate driving circuit 30 onto the base substrate 54 of the display substrate at least partially overlaps with an orthographic projection of the anode pattern onto the base substrate 54.

It should be noted that a boundary encapsulation 40 is also illustrated in FIG. 3.

Illustratively, the multiple sub-pixels are distributed in an array. The anode pattern is located on the side of the sub-pixel driving circuit 101 facing away from the base substrate 54, and the sub-pixel driving circuit 101 is used to provide a driving signal to the anode pattern.

Illustratively, the display substrate also includes gate driving circuits 30, and the gate driving circuits 30 can be distributed in a left bezel and/or a right bezel of the display substrate according to practical requirements. The gate driving circuit 30 is coupled to the corresponding at least one row of sub-pixel driving circuits 101 for providing scanning signals to the corresponding at least one row of sub-pixel driving circuits 101.

Illustratively, the gate driving circuits 30 of the display substrate at least partially overlap with the partition structure. For example: the gate driving circuits 30 at least partially overlap with the first-part partition pillars 55Z-1.

Illustratively, at the left bezel of the display substrate, an orthographic projection of the gate driving circuits 30 onto the base substrate 54 at least partially overlaps with the orthographic projection of the anode pattern R-102 of the red sub-pixel onto the base substrate 54; and/or, the orthographic projection of the gate driving circuits 30 onto the base substrate 54 at least partially overlaps with the orthographic projection of the anode pattern B-102 of the blue sub-pixel onto the base substrate 54.

Illustratively, at the right bezel of the display substrate, an orthographic projection of the gate driving circuits 30 onto the base substrate 54 at least partially overlaps with the orthographic projection of the anode pattern G-102 of the green sub-pixel onto the base substrate 54; and/or, the orthographic projection of the gate driving circuits 30 onto the base substrate 54 at least partially overlaps with the orthographic projection of the anode pattern B-102 of the blue sub-pixel onto the base substrate 54.

Illustratively, between two adjacent sub-pixel driving circuits 101 of a display region of the display substrate: the orthographic projection of the gate driving circuits 30 onto the base substrate 54 at least partially overlaps with the orthographic projection of the anode pattern G-102 of the green sub-pixel onto the base substrate 54; and/or, the orthographic projection of the gate driving circuits 30 onto the base substrate 54 at least partially overlaps with the orthographic projection of the anode pattern B-102 of the blue sub-pixel onto the base substrate 54.

Illustratively, the orthographic projection of the gate driving circuits 30 onto the base substrate 54 of the display substrate is completely covered by the orthographic projection of the anode patterns onto the base substrate 54.

In the display substrate provided in the above-mentioned embodiment, by arranging the orthographic projection of the gate driving circuits 30 onto the base substrate 54 of the display substrate to at least partially overlap with the orthographic projection of the anode pattern onto the base substrate 54, the layout of at least a portion of the gate driving circuits 30 in the display region 10 is achieved, the bezel width occupied by the gate driving circuits 30 is reduced, and the bezel width of the display substrate is further reduced. When the display substrate is applied to a spliced screen, the splicing seam can be effectively narrowed, which is beneficial to improving the user experience.

Figure 5:
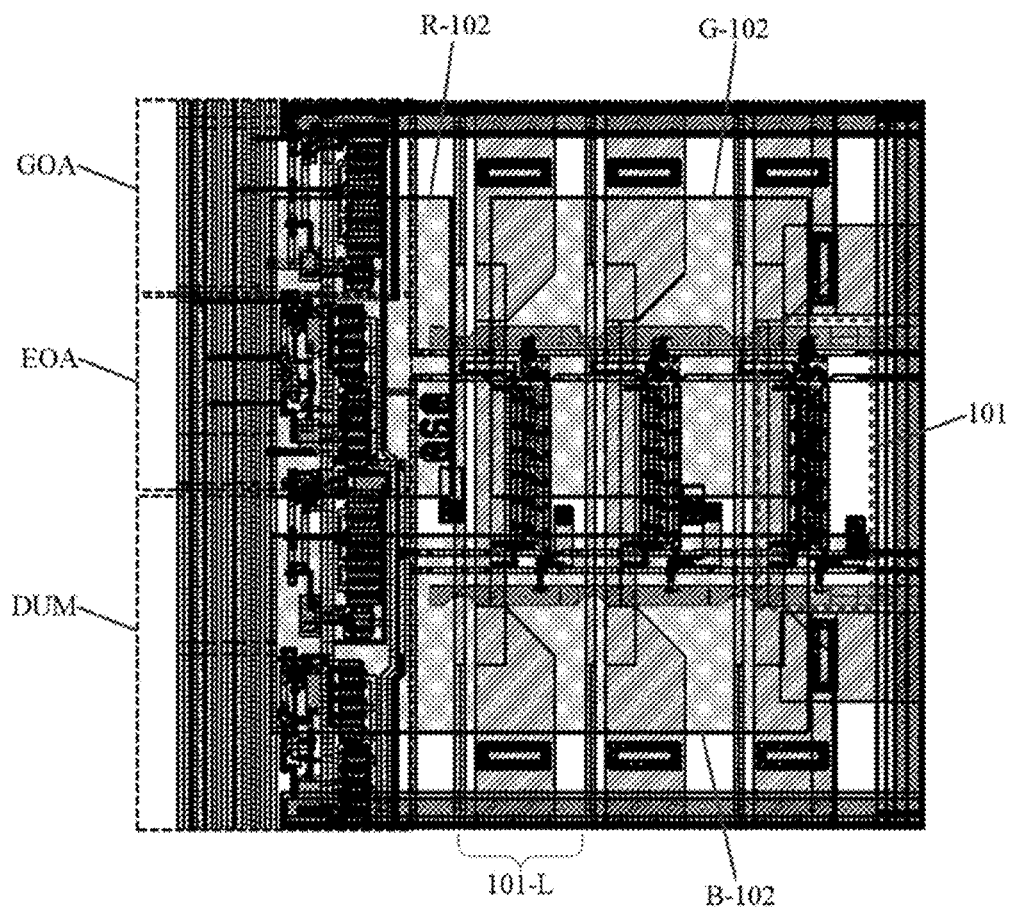
FIG. 5 is a schematic diagram of an alternating arrangement of a scanning control driving circuit and a light-emitting control driving circuit according to an embodiment of the present disclosure.

As shown in FIG. 5, in some embodiments, multiple sub-pixel driving circuits 101 included by the multiple sub-pixels are distributed in an array, the multiple sub-pixel driving circuits 101 are divided into multiple columns of sub-pixel driving circuits 101-L, the columns being arranged along a first direction, each column of sub-pixel driving circuits 101-L includes multiple sub-pixel driving circuits 101 arranged along a second direction, and the first direction intersects with the second direction.

The multiple gate driving circuits 30 include: multiple light-emitting control driving circuits EOA and multiple scanning control driving circuits GOA. On a same side of the display substrate, the light-emitting control driving circuits EOA alternate with the scanning control driving circuits GOA along the second direction.

Illustratively, the first direction includes a transverse direction and the second direction includes a longitudinal direction.

Illustratively, the multiple gate driving circuits 30 include: multiple light-emitting control driving circuits EOA and multiple scanning control driving circuits GOA. The light-emitting control driving circuit is used for providing a light-emitting control signal. The scanning control driving circuit is for providing a gate control signal.

Figure 4:
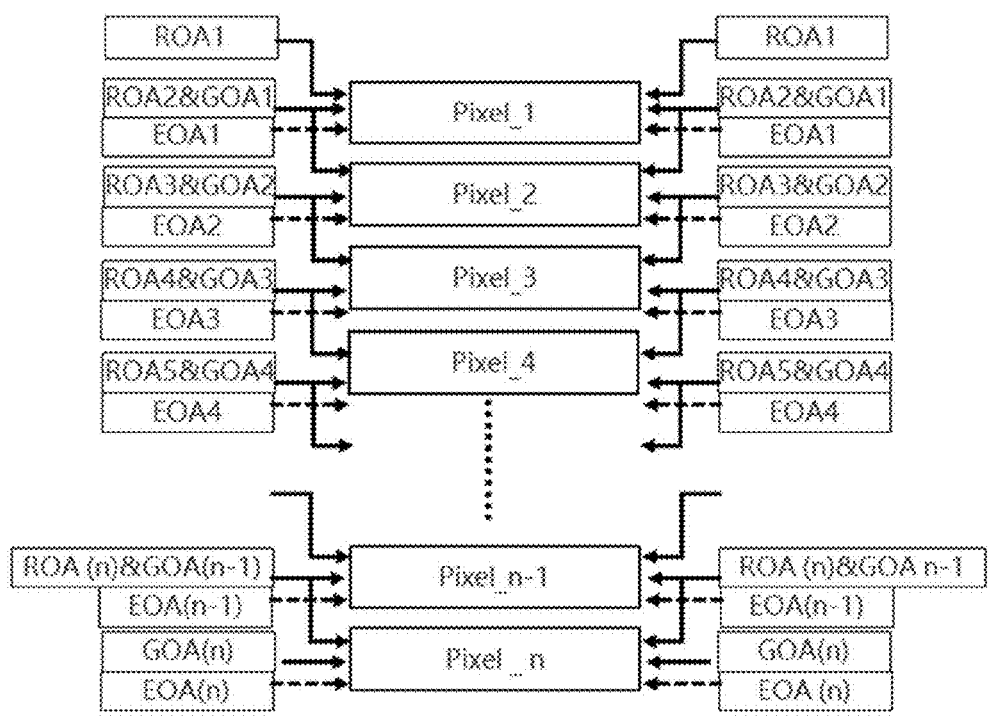
FIG. 4 is a schematic diagram showing a gate driving circuit providing a signal to a corresponding sub-pixel driving circuit according to an embodiment of the present disclosure.

As shown in FIG. 4, illustratively, the light-emitting control driving circuits (e.g., EOA1 to EOA(n)) correspond to a row of sub-pixel driving circuits 101, and provide light-emitting control signals to the corresponding row of sub-pixel driving circuits 101. At least some of the scanning control driving circuits GOA (e.g., GOA1 to GOA(n−1)) are reused as reset control circuits (e.g., ROA2 to ROA(n−2)), and can provide gate control signals to a corresponding row of sub-pixel driving circuits 101 while providing reset control signals to a row of sub-pixel driving circuits 101 adjacent to the corresponding row of sub-pixel driving circuits 101.

It is be noted that the display substrate also includes a reset control circuit ROA1. On the same side of the display substrate, the reset control circuit ROA1, the light-emitting control driving circuit EOA and the scanning control driving circuit GOA are arranged along the second direction.

It should be noted that Pixel_1 to Pixel_n illustrated in FIG. 4 are the first row of sub-pixel driving circuits to the nth row of sub-pixel driving circuits, respectively.

Illustratively, at the left bezel of the display substrate, the orthographic projection of the light-emitting control driving circuit EOA onto the base substrate 54 at least partially overlaps with the orthographic projection of the anode pattern R-102 of the red sub-pixel onto the base substrate 54. The orthographic projection of the scanning control driving circuit GOA onto the base substrate 54 at least partially overlaps with the orthographic projection of the anode pattern R-102 of the red sub-pixel onto the base substrate 54.

Illustratively, at the right bezel of the display substrate, the orthographic projection of the light-emitting control driving circuit EOA onto the base substrate 54 at least partially overlaps with the orthographic projection of the anode pattern G-102 of the green sub-pixel onto the base substrate 54. The orthographic projection of the scanning control driving circuit GOA onto the base substrate 54 at least partially overlaps with the orthographic projection of the anode pattern G-102 of the green sub-pixel onto the base substrate 54.

Illustratively, at the left bezel and/or right bezel of the display substrate: the anode patterns may cover all transistors and capacitors included in the light-emitting control driving circuits and/or the scanning control driving circuits, or may cover some of the transistors and some of the capacitors included in the light-emitting control driving circuits and/or the scanning control driving circuits.

Illustratively, at the left bezel and/or right bezel of the display substrate: the anode patterns may cover all the signal lines to which the light-emitting control driving circuits and/or the scanning control driving circuits are connected, or may cover some of the signal lines to which the light-emitting control driving circuits and/or the scanning control driving circuits are connected.

Illustratively, at the left bezel and/or right bezel of the display substrate: the orthographic projection of a boundary of the anode patterns onto the base substrate overlaps with the orthographic projection of a boundary of a first level signal line VGH onto the base substrate.

Illustratively, at the left bezel and/or right bezel of the display substrate: the anode patterns covers at least a portion of the first level signal line VGH.

Illustratively, at the left bezel and/or right bezel of the display substrate: the anode patterns does not cover the second clock line GCK.

Illustratively, at the left bezel and/or right bezel of the display substrate: two anode patterns, which may correspond to sub-pixels of different colors, cover the transistors of the same light-emitting control driving circuit and/or scanning control driving circuit.

It is to be noted that, in determining the degree of coverage between the anode patterns and the gate driving circuit and signal lines, the parasitic capacitance generated by the coverage and the requirements on the bezel width are mainly considered.

Illustratively, the display substrate also includes multiple dummy driving circuits DUM. Every two dummy driving circuits DUM are divided into one group, and at the left bezel and/or right bezel of the display substrate, a pattern formed by the scanning control driving circuit, the light-emitting control driving circuit, and one group of dummy driving circuits DUM, which are arranged sequentially, occurs repeatedly.

Illustratively, an orthographic projection of the dummy driving circuits DUM onto the base substrate 54 at least partially overlaps with the orthographic projection of the anode pattern B-102 of the blue sub-pixel onto the base substrate 54.

Illustratively, at the left bezel of the display substrate, the orthographic projection of the dummy driving circuits DUM onto the base substrate 54 at least partially overlaps with the orthographic projection of the anode pattern R-102 of the red sub-pixel onto the base substrate 54.

Illustratively, at the right bezel of the display substrate, the orthographic projection of the dummy driving circuits DUM onto the base substrate 54 at least partially overlaps with the orthographic projection of the anode pattern G-102 of the green sub-pixel onto the base substrate 54.

It is noted that, in determining the color sub-pixel of which the anode pattern covers the gate driving circuits and the dummy driving circuits DUM, the actual arrangement of the sub-pixels may be taken into account, and the present disclosure is not limited to the above exemplary way.

In the above-mentioned arrangement, on the same side of the display substrate, the light-emitting control driving circuits EOA alternate with the scanning control driving circuits GOA along the second direction, so that the bezel width occupied by the gate driving circuits 30 and the dummy driving circuits DUM is reduced, and the bezel width of the display substrate is reduced. When the display substrate is applied to a spliced screen, the splicing seam can be effectively narrowed, which is beneficial to improving the user experience.

The specific structures of the light-emitting control driving circuit EOA and the scanning control driving circuit GOA are varied, and the specific structures and specific layout manners of the light-emitting control driving circuit EOA and the scanning control driving circuit GOA are described illustratively hereinafter.

Figure 6:
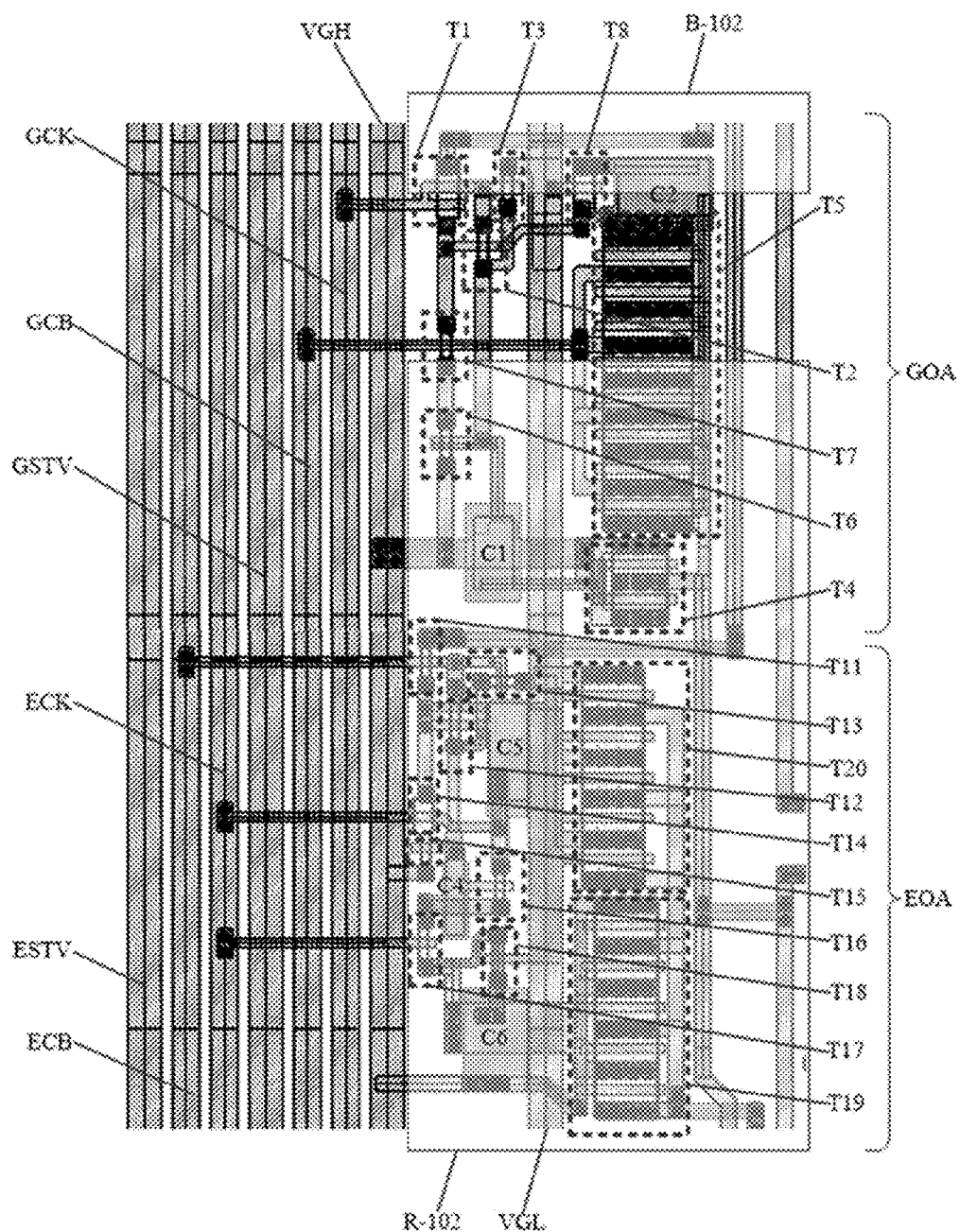
FIG. 6 is a schematic layout diagram of a scanning control driving circuit and a light-emitting control driving circuit according to an embodiment of the present disclosure.

As shown in FIG. 6, the display substrate also includes: a first frame start line GSTV, a first clock line GCB, a second clock line GCK, a first level signal line VGH, a second level signal line VGL, a second frame start line ESTV, a third clock line ECB, and a fourth clock line ECK.

Figure 7:
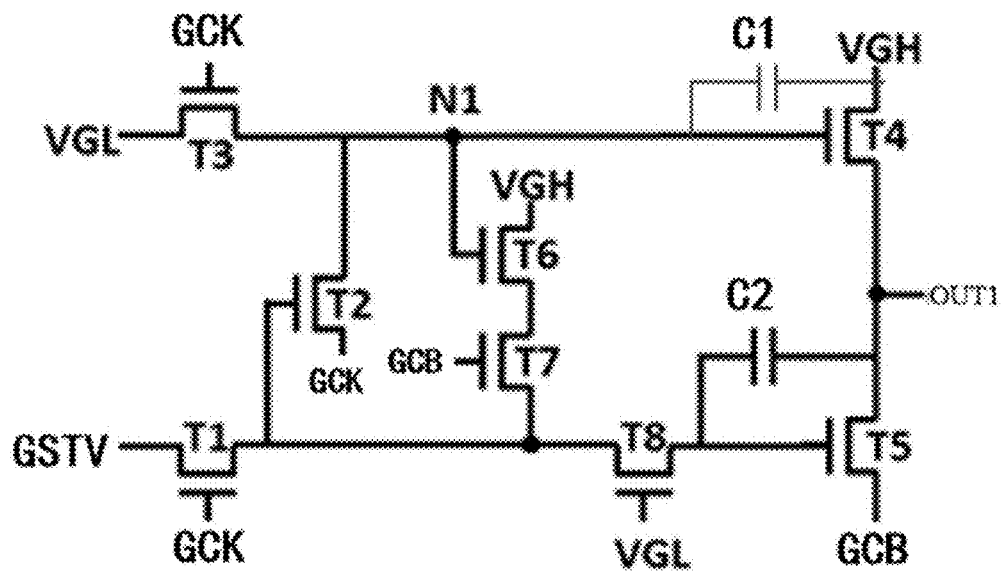
FIG. 7 is a circuit structural diagram of a scanning control driving circuit according to an embodiment of the present disclosure.

As shown in FIGS. 6 and 7, the scanning control driving circuit GOA includes: a first transistor T1 to an eighth transistor T8, and a first capacitor C1 and a second capacitor C2. A gate electrode of the first transistor T1 is coupled to the second clock line GCK. A first electrode of the first transistor T1 is coupled to a first frame start line GSTV, and a second electrode of the first transistor T1 is coupled to a gate electrode of a second transistor T2. A first electrode of the second transistor T2 is coupled to the second clock line GCK, and a second electrode of the second transistor T2 is coupled to a second electrode of a third transistor T3. A gate electrode of the third transistor T3 is coupled to the second clock line GCK, and a first electrode of the third transistor T3 is coupled to a second level signal line VGL. A gate electrode of a fourth transistor T4 is coupled to a second electrode of the third transistor T3 to form a first node N1, a first electrode of the fourth transistor T4 is coupled to a first level signal line VGH, and a second electrode of the fourth transistor T4 is coupled to an output terminal OUT1. A gate electrode of a fifth transistor T5 is coupled to a second electrode of an eighth transistor T8, a first electrode of the fifth transistor T5 is coupled to a first clock line GCB, and a second electrode of the fifth transistor T5 is coupled to the output terminal OUT1. A gate electrode of the sixth transistor T6 is coupled to the first node N1, the first electrode of the sixth transistor T6 is coupled to the first level signal line VGH, the second electrode of the sixth transistor T6 is coupled to the first electrode of the seventh transistor T7. A gate electrode of the seventh transistor T7 is coupled to the first clock line GCB, the second electrode of the seventh transistor T7 is coupled to the first electrode of the eighth transistor T8, and a gate electrode of the eighth transistor T8 is coupled to the second level signal line VGL. A first terminal of the first capacitor C1 is coupled to the first level signal line VGH, and a second terminal of the first capacitor C1 is coupled to the gate electrode of the fourth transistor T4. A first terminal of the second capacitor C2 is coupled to a second electrode of the fifth transistor T5, and a second terminal of the second capacitor C2 is coupled to a gate electrode of the fifth transistor T5.

At the left bezel of the display substrate, along a direction towards the first sub-display area, a second frame start line ESTV, a third clock line ECB, a fourth clock line ECK, a first frame start line GSTV, a first clock line GCB, a second clock line GCK, a first level signal line VGH, and a second level signal line VGL.

A fifth transistor T5 and a fourth transistor T4 are located between the second level signal line VGL and the first sub-display area, and the fifth transistor T5 and the fourth transistor T4 are arranged along the second direction. The first transistor T1, the seventh transistor T7, and the sixth transistor T6 are arranged along the second direction. The first transistor T1 and the third transistor T3 are arranged along the first direction.

Figure 8:
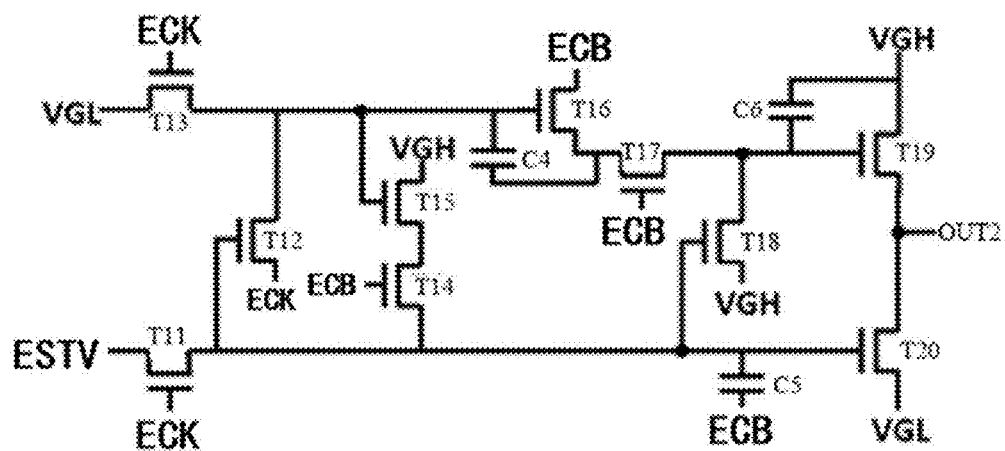
FIG. 8 is a circuit structural diagram of a light-emitting control driving circuit according to an embodiment of the present disclosure.

As shown in FIGS. 6 and 8, the light-emitting control driving circuit EOA includes: an eleventh transistor TH1 to a twentieth transistor T20, and a fourth capacitor C4, a fifth capacitor C5, and a sixth capacitor C6.

A gate electrode of an eleventh transistor T11 is coupled to the fourth clock line ECK, a first electrode of the eleventh transistor T11 is coupled to a second frame start line ESTV, and a second electrode of the eleventh transistor TH1 is coupled to a gate electrode of a twelfth transistor T12. A first electrode of the twelfth transistor T12 is coupled to the fourth clock line ECK, and a second electrode of the twelfth transistor T12 is coupled to a second electrode of a thirteenth transistor T13. A gate electrode of the thirteenth transistor T13 is coupled to the fourth clock line ECK, and a first electrode of the thirteenth transistor T13 is coupled to a second level signal line VGL. A gate electrode of a fourteenth transistor T14 is coupled to a third clock line ECB, a first electrode of the fourteenth transistor T14 is coupled to a second electrode of a fifteenth transistor T15, and a second electrode of the fourteenth transistor T14 is coupled to a second electrode of the eleventh transistor T11. A gate electrode of the fifteenth transistor T15 is coupled to a second electrode of the thirteenth transistor T13, and a first electrode of the fifteenth transistor T15 is coupled to a first level signal line VGH. A gate electrode of the sixteenth transistor T16 is coupled to the gate electrode of the fifteenth transistor T15, the first electrode of the sixteenth transistor T16 is coupled to the third clock line ECB, and the second electrode of the sixteenth transistor T16 is coupled to a first electrode of the seventeenth transistor T17. A second electrode of the seventeenth transistor T17 is coupled to a second electrode of the eighteenth transistor T18, and the gate electrode of the seventeenth transistor T17 is coupled to the third clock line ECB. A gate electrode of the eighteenth transistor T18 is coupled to the second electrode of the eleventh transistor T11, and the first electrode of the eighteenth transistor T18 is coupled to the first level signal line VGH. A gate electrode of the nineteenth transistor T19 is coupled to the second electrode of the eighteenth transistor T18, the first electrode of the nineteenth transistor T19 is coupled to the first level signal line VGH, and the second electrode of the nineteenth transistor T19 is coupled to the output terminal OUT2. A gate electrode of the twentieth transistor T20 is coupled to the gate electrode of the eighteenth transistor T18, the first electrode of the twentieth transistor T20 is coupled to the second level signal line VGL, and the second electrode of the twentieth transistor T20 is coupled to the output terminal OUT2. A first terminal of the fourth capacitor C4 is coupled to the gate electrode of the sixteenth transistor T16, and a second terminal of the fourth capacitor C4 is coupled to the second electrode of the sixteenth transistor T16. A first terminal of the fifth capacitor C5 is coupled to the third clock line ECB, and a second terminal of the fifth capacitor C5 is coupled to the gate electrode of the twentieth transistor T20. A first terminal of the sixth capacitor C6 is coupled to the gate electrode of the nineteenth transistor T19, and a second terminal of the sixth capacitor C6 is coupled to the first level signal line VGH.

The nineteenth transistor T19 and the twentieth transistor T20 are located between the second level signal line VGL and the first sub-display area, and the nineteenth transistor T19 and the twentieth transistor T20 are arranged along the second direction. The thirteenth transistor T13, the sixteenth transistor T16, and the eighteenth transistor T18 are arranged along the second direction. The eleventh transistor T11 and the thirteenth transistor T13 are arranged along the first direction. The eleventh transistor TH1, the fourteenth transistor T14, the fifteenth transistor T15, and the seventeenth transistor T17 are arranged along the first direction.

In the display substrate provided by the above-mentioned embodiments, by arranging the light-emitting control driving circuit EOA and the scanning control driving circuit GOA in the above-mentioned manner, the width of the layout space occupied in the first direction by the light-emitting control driving circuit EOA and the scanning control driving circuit GOA is effectively reduced, facilitating the narrowing of the bezel of the display substrate.

Figure 9:
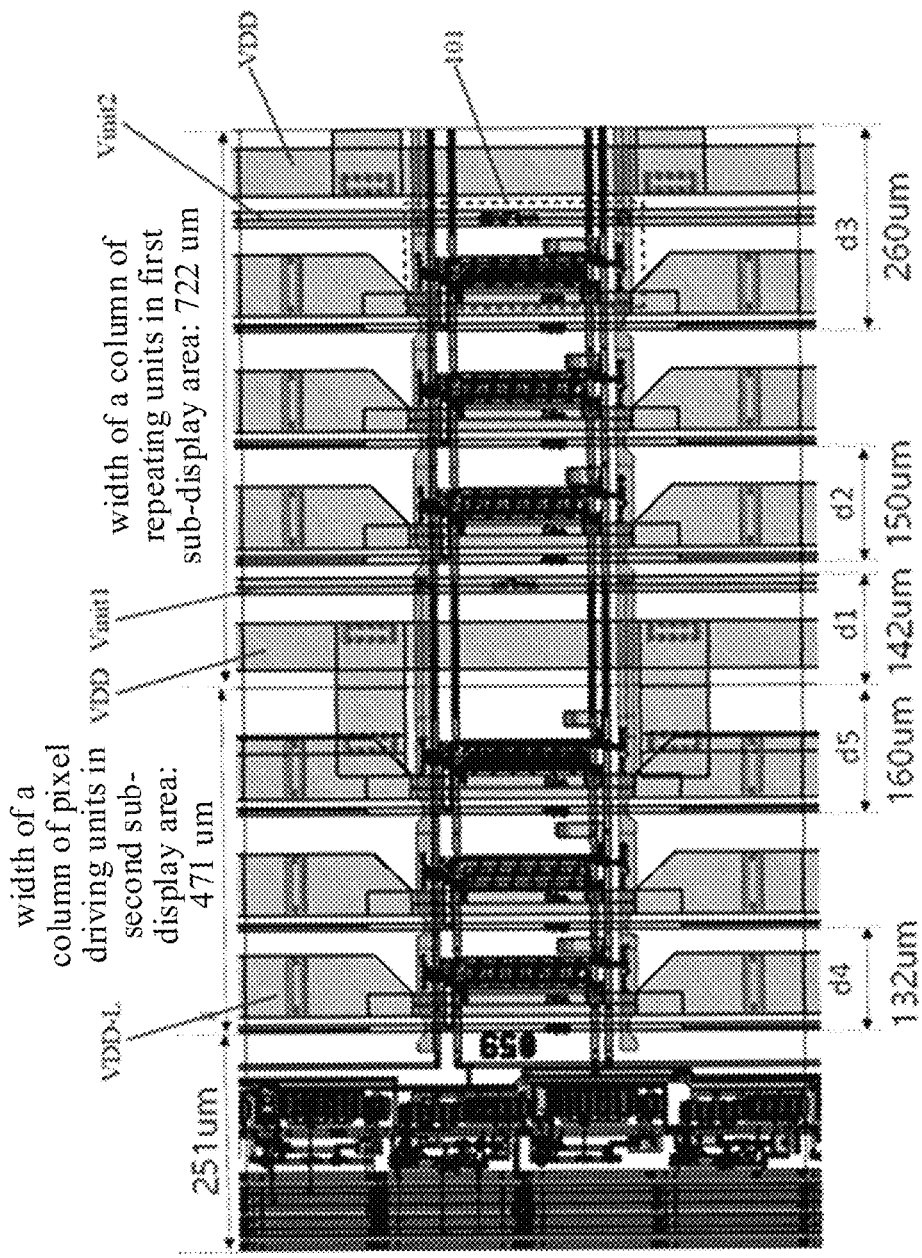
FIG. 9 is a schematic diagram showing shrinking in width of a second sub-display area according to an embodiment of the present disclosure.

As shown in FIG. 9, in some embodiments, the display region 10 includes a first sub-display area and a second sub-display area, and the gate driving circuits 30 are located in at least one second sub-display area.

A distance between at least two adjacent columns of sub-pixel driving circuits 101 in the second sub-display area is less than a distance between two adjacent columns of sub-pixel driving circuits 101 in the first sub-display area.

Illustratively, the display region 10 includes a first sub-display area and two second sub-display areas, and the first sub-display area is located between the two second sub-display areas. One of the two second sub-display areas is close to the left bezel of the display substrate, and the other of the two second sub-display areas is close to the right bezel of the display substrate.

Illustratively, the width of the second sub-display area may be set according to actual needs. A column of pixel units may be included in the second sub-display area, and the column of pixel units may include a column of sub-pixel driving circuits corresponding the red sub-pixels, a column of sub-pixel driving circuits corresponding the green sub-pixels, and a column of sub-pixel driving circuits corresponding the blue sub-pixels. Multiple columns of pixel units may be included in the first sub-display area.

Illustratively, both the first sub-display area and the second sub-display area have multiple columns of sub-pixel driving circuits 101.

Illustratively, the distance between any two adjacent columns of sub-pixel driving circuits 101 in the second sub-display area is less than the distance between any two adjacent columns of sub-pixel driving circuits 101 in the first sub-display area.

Illustratively, a distance between at least two adjacent data lines in the second sub-display area is less than a distance between two adjacent data lines in the first sub-display area.

Illustratively, the first initialization signal line Vinit1 and the second initialization signal line Vinit2 are not provided in the second sub-display area.

Illustratively, the display substrate also includes a power supply connection part VDD-L capable of connecting all the power supply lines VDD included in the display substrate into a mesh shape. The distance between at least two adjacent power supply connection parts VDD-L in the second sub-display area along the first direction is less than the distance between two adjacent power supply connection parts VDD-L in the first sub-pixel area.

In the display substrate provided by the above-mentioned embodiments, by setting the distance between at least two adjacent columns of sub-pixel driving circuits 101 in the second sub-display area to be less than the distance between two adjacent columns of sub-pixel driving circuits 101 in the first sub-display area, an extra layout space can be spared on the side of the second sub-display area away from the first sub-display area, so that the gate driving circuit 30 can be laid out in the extra layout space. Therefore, in the display substrate provided by the above-mentioned embodiments, the gate driving circuit 30 can be arranged in the second sub-display area without reducing the pixel resolution, thereby better achieving the narrowing of the bezel of the display substrate while ensuring the display effect of the display substrate.

In some embodiments, the second sub-display area includes three columns of sub-pixel driving circuits 101, and in the second sub-display area, the distance between any two adjacent columns of sub-pixel driving circuits 101 is less than the distance between any two adjacent columns of sub-pixel driving circuits 101 in the first sub-display area.

In some embodiments, the second sub-display area includes three columns of sub-pixel driving circuits 101. The distance between a pair of adjacent columns of sub-pixel driving circuits 101 in the second sub-display area is less than the distance between two adjacent columns of sub-pixel driving circuits 101 in the first sub-display area, and the distance between another pair of adjacent columns of sub-pixel driving circuits 101 in the second sub-display area is equal to the distance between two adjacent columns of sub-pixel driving circuits 101 in the first sub-display area.

Illustratively, in the second sub-display area, a distance d4 between a pair of adjacent columns of sub-pixel driving circuits 101 is between 127 μm and 137 μm, and the distance between another pair of adjacent columns of sub-pixel driving circuits 101 is between 145 μm and 155 μm. In the first sub-display area, a distance d2 between two adjacent columns of sub-pixel driving circuits 101 is between 145 μm and 155 μm.

As shown in FIG. 9, illustratively, in the second sub-display area, the distance d4 between a pair of adjacent columns of sub-pixel driving circuits 101 is 132 μm, and a distance between another pair of adjacent columns of sub-pixel driving circuits 101 is 150 μm. In the first sub-display area, the distance d2 between two adjacent columns of sub-pixel driving circuits 101 is 150 μm.

In the display substrate provided by the above-mentioned embodiments, the sub-pixel driving circuit 101 in the second sub-display area can be moved towards the first sub-display area, so that the layout space occupied by the sub-pixel driving circuit 101 in the second sub-display area is reduced, to spare an extra layout space at a side of the second sub-display area away from the first sub-display area. In this way, the gate driving circuit 30 can be laid out in the extra layout space. Therefore, in the display substrate provided by the above-mentioned embodiments, the gate driving circuit 30 can be arranged in the second sub-display area without reducing the pixel resolution, thereby better achieving the narrowing of the bezel of the display substrate while ensuring the display effect of the display substrate. When the display substrate is applied to a spliced screen, the splicing seam can be effectively narrowed, which is beneficial to improving the user experience.

In some embodiments, along the first direction, a width of the second sub-display area is substantially the same as a width of a layout region occupied by a repeating unit in the first sub-display area, and the repeating unit includes three adjacent columns of sub-pixel driving circuits, and signal lines located on both sides of the three adjacent columns of sub-pixel driving circuits along the first direction.

As shown in FIG. 9, illustratively, the width of the second sub-display area along the first direction is 251 μm+471 μm=722 μm. Along the first direction, the width of a layout region occupied by the repeating unit in the first sub-display area is 722 μm.

Illustratively, the signal lines located on both sides of the three adjacent columns of sub-pixel driving circuits along the first direction include: a power supply line VDD, a first initialization signal line Vinit1, and a second initialization signal line Vinit2.

Illustratively, in the second sub-display area, the signal lines located on both sides of three adjacent columns of sub-pixel driving circuits along the first direction are removed, thereby sparing a layout space d1+(d3−d5). Meanwhile, in the second sub-display area, the distance between two adjacent columns of sub-pixel driving circuits is shortened by d2−d4. Thus, in the second sub-display area, a column of sub pixel driving circuits 101 closest to the left bezel is moved toward the first sub-display area by a distance of d1+(d3−d5)+(d2−d4). Illustratively, d1=142 μm, d2=150 μm, d3=260 μm, d4=132 μm, and d5=160 μm.

Illustratively, the value of d1 is between 137 μm and 147 μm. The value of d3 is between 255 μm and 265 μm. The value of d5 is between 155 μm and 165 μm.

The specific structures of the sub-pixel driving circuit are varied. Illustratively, the sub-pixel driving circuit includes a 7T1C structure (namely, including 7 transistors and 1 capacitor), but the present disclosure is not limited thereto.

Figure 10:
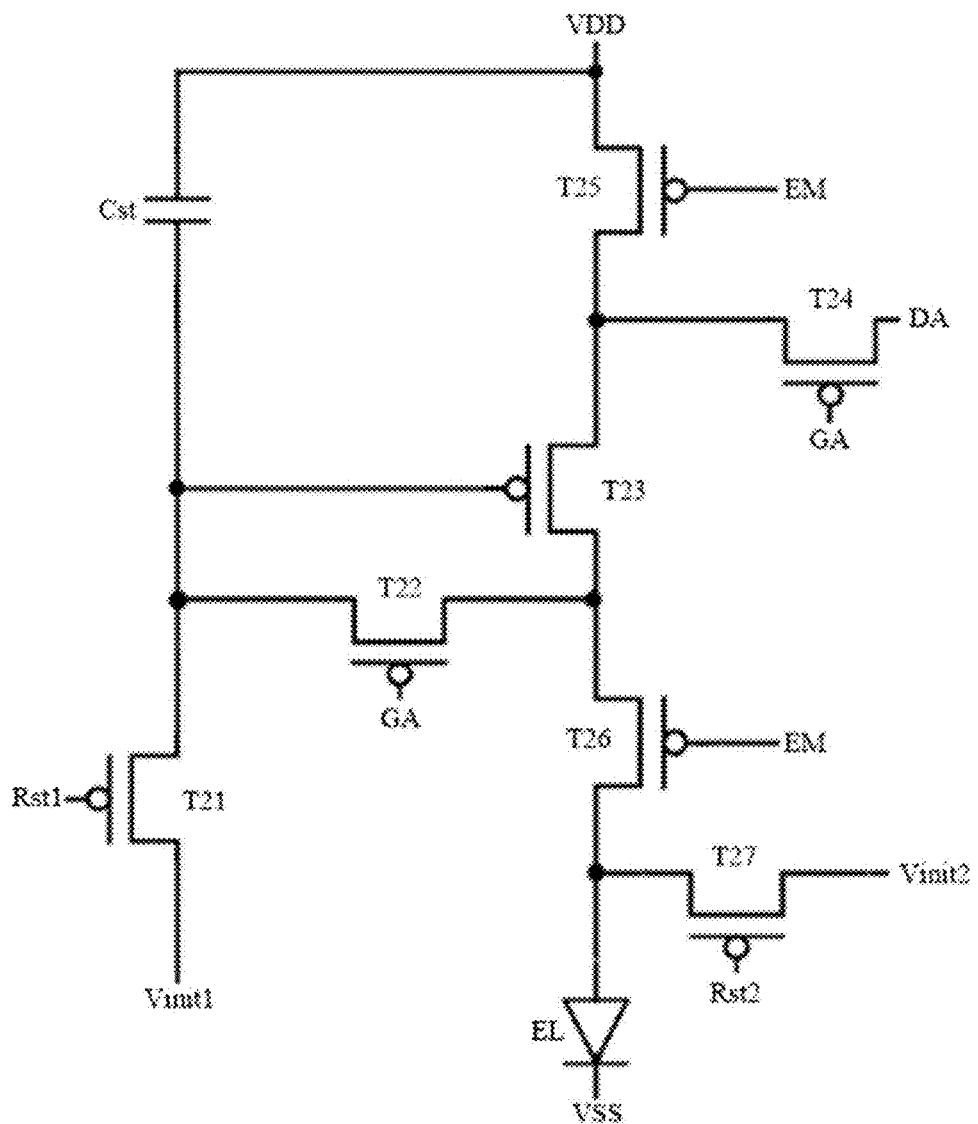
FIG. 10 is a circuit structural diagram of a sub-pixel driving circuit according to an embodiment of the present disclosure.

As shown in FIG. 10, the sub-pixel driving circuit includes: a twenty-first transistor T21, a twenty-second transistor T22, a twenty-third transistor T23 (namely, a driving transistor), a twenty-fourth transistor T24, a twenty-fifth transistor T25, a twenty-sixth transistor T26, a twenty-seventh transistor T27, and a storage capacitor Cst.

The gate electrode of the twenty-first transistor T21 is coupled to the first reset line Rst1, the first electrode of the twenty-first transistor T21 is coupled to the first initialization signal line Vinit1, and the second electrode of the twenty-first transistor T21 is coupled to the gate electrode of the twenty-third transistor T23.

The gate electrode of the twenty-second transistor T22 is coupled to the gate line GA, the first electrode of the twenty-second transistor T22 is coupled to the second electrode of the twenty-third transistor T23, and the second electrode of the twenty-second transistor T22 is coupled to the gate electrode of the twenty-third transistor T23.

The gate electrode of the twenty-fourth transistor T24 is coupled to the gate line GA, the first electrode of the twenty-fourth transistor T24 is coupled to the data line DA, and the second electrode of the twenty-fourth transistor T24 is coupled to the first electrode of the twenty-third transistor T23.

The gate electrode of the twenty-fifth transistor T25 is coupled to the light-emitting control line EM, the first electrode of the twenty-fifth transistor T25 is coupled to the power supply line VDD, and the second electrode of the twenty-fifth transistor T25 is coupled to the first electrode of the twenty-third transistor T23.

The gate electrode of the twenty-sixth transistor T26 is coupled to the light-emitting control line EM, the first electrode of the twenty-sixth transistor T26 is coupled to the second electrode of the twenty-third transistor T23, and the second electrode of the twenty-sixth transistor T26 is coupled to the anode of the light-emitting element EL.

The gate electrode of the twenty-seventh transistor T27 is coupled to the second reset line Rst2, the first electrode of the twenty-seventh transistor T27 is coupled to the second initialization signal line Vinit2, and the second electrode of the twenty-seventh transistor T27 is coupled to the anode of the light-emitting element EL.

The cathode of the light-emitting element EL receives a negative power supply signal.

Illustratively, each of the transistors is of the same type, such as a P-type transistor (e.g., P-channel metal oxide semiconductor (PMOS)) or an N-type transistor (e.g., N-channel metal oxide semiconductor (NMOS)). Or, some of the transistors may be P-type transistors (e.g., PMOS) and some of the transistors are N-type transistors (e.g., NMOS).

Illustratively, the first initialization signal transmitted by the first initialization signal line Vinit1 may be the same as or may be different from the second initialization signal transmitted by the second initialization signal line Vinit2.

Illustratively, the first initialization signal line Vinit1 may have a mesh-like structure. The mesh-like structure includes a first initial portion and a second initial portion arranged in different layers. The first initial portion includes at least a portion extending along a horizontal direction, and the second initial portion includes at least a portion extending in a vertical direction. Illustratively, the first initial portion may be made of a second gate metal layer in the display substrate, and the second initial portion may be made of a first source drain metal layer or a second source drain metal layer in the display substrate. The first initial portion and the second initial portion may be electrically connected through a via hole. Similarly, the second initialization signal line Vinit2 may also adopt the above-mentioned mesh-like structure.

Illustratively, all power supply lines in the display substrate may be connected into a mesh structure, and the resulting mesh structure may be coupled to all sub-pixel driving circuits included in the display substrate.

In the display substrate provided by the above-mentioned embodiments, the gate driving circuit 30 can be arranged in the second sub-display area without reducing the pixel resolution, thereby better achieving the narrowing of the bezel of the display substrate while ensuring the display effect of the display substrate. When the display substrate is applied to a spliced screen, the splicing seam can be effectively narrowed, which is beneficial to improving the user experience.

In some embodiments, at least some of widths of layout spaces occupied in the first direction by the sub-pixel driving circuits 101 located in the second sub-display area are less than widths of layout spaces occupied in the first direction by the sub-pixel driving circuits 101 located in the first sub-display area.

In the second sub-display area, in addition to reducing the layout space occupied by the multiple columns of sub-pixel driving circuits 101 by decreasing the distance between two adjacent columns of sub-pixel driving circuits 101, the layout space occupied by the multiple columns of sub-pixel driving circuits 101 may also be reduced by decreasing the width of the layout space occupied in the first direction by the sub-pixel driving circuits 101.

In the display substrate provided in the above-mentioned embodiment, by setting at least some of widths of layout spaces occupied in the first direction by the sub-pixel driving circuits 101 located in the second sub-display area to be less than widths of layout spaces occupied in the first direction by the sub-pixel driving circuits 101 located in the first sub-display area, an extra layout space can be spared at a side of the second sub-display area away from the first sub-display area, so that the gate driving circuit 30 can be laid out in the extra layout space. Therefore, in the display substrate provided by the above-mentioned embodiments, the gate driving circuit 30 can be arranged in the second sub-display area without reducing the pixel resolution, thereby better achieving the narrowing of the bezel of the display substrate while ensuring the display effect of the display substrate. When the display substrate is applied to a spliced screen, the splicing seam can be effectively narrowed, which is beneficial to improving the user experience.

Embodiments of the present disclosure also provide a display device including the display substrate provided by the above embodiments.

It is noted that the display device may be any product or component with a display function, such as a television, a display, a digital photo frame, a mobile phone, a tablet computer, wherein the display device further includes a flexible circuit board, a printed circuit board and a backboard, etc.

In the display substrate provided in the above-mentioned embodiment, the partition structure is provided in the bezel region 20, so that the cathode layer 50 can be naturally broken at the position where the partition structure is located, avoiding performing a patterning process on the cathode layer 50; therefore, it is not necessary to reserve a cathode layer 50 with a sufficient width in the bezel region 20, and the manufacturing yield of the cathode layer 50 can also be ensured.

Therefore, in the display substrate according to the above embodiments of the present disclosure, it is not necessary to reserve a cathode layer 50 with a sufficient width in the bezel region 20, and accordingly the bezel width of the display substrate can be effectively narrowed, which facilitates the narrowing of the bezel of the display substrate. In this way, when the display substrate is applied to an OLED spliced screen, the splicing seam can be effectively reduced and the user experience can be improved. When the display substrate is applied to the OLED spliced screen, the splicing seam can be reduced to 1 mm.

In the display substrate provided in the above-mentioned embodiment, the partition structure includes multiple partition pillars 55, the multiple partition pillars 55 include first-part partition pillars 55Z-1 and second-part partition pillars 55Z-2, the first-part partition pillars 55Z-1 are located between the display region 10 and the second-part partition pillars 55Z-2, thus better partition of the cathode layer 50 by the partition structure is ensured.

In the display substrate according to an embodiment of the present disclosure, in a direction perpendicular to the base substrate of the display substrate, the distance between each of the second-part partition pillars and the surface of the base substrate is less than the distance between each of the first-part partition pillars and the surface of the base substrate, therefore, the edge of the display substrate is prevented from buckling upward due to too high partition pillars.

Therefore, the display device provided by the embodiments of the present disclosure has the above-mentioned advantageous effects as well when including the above-mentioned display substrate, and the description thereof will not be repeated here.

It is noted that the expression "same layer" used in the embodiments of the present disclosure may refer to film layers in the same structural layer. Or, for example, the film layers in the same layer may be a layer structure resulting from forming a film layer for forming a specific pattern by using the same film-forming process, and then patterning the film layer by using a single patterning process using the same mask. Depending on the particular pattern, the single patterning process may include multiple exposure, development, or etching processes, and the particular pattern in the resultant layer structure may or may not be continuous. These particular patterns may also be at different heights or have different thicknesses.

In the various method embodiments of the present disclosure, the serial numbers of various steps are not intended to limit the order of the steps, and a change in the order of the steps made by those of ordinary skill in the art, without involving inventive effort, is also within the scope of the present disclosure.

It should be noted that the various embodiments described herein are described in a progressive manner, the same or similar part among various embodiments may be referred with each other, and the description of each embodiment focuses on its difference from other embodiments. In particular, the method embodiments are described more simply because they are substantially similar to the product embodiments: for description of relevant features, references may be made to the description of the product embodiments.

Unless defined otherwise, technical or scientific terms used in this disclosure shall have the ordinary meaning as understood by those of ordinary skills in the art to which this disclosure belongs. The terms "first" and "second" and similar expressions used in this disclosure do not imply any order, quantity, or importance, but are used only to distinguish different components. The word "including", "comprising" or the like means that an element or item preceding the word encompasses the elements or items listed after the word and equivalents thereof, but does not exclude other elements or items. The terms "connect", "couple", or "connected", and the like, are not limited to physical or mechanical connections, but may include electrical connections, whether direct or indirect. The terms "upper", "lower", "left". "right" and the like are used only to indicate relative positional relationships that may change accordingly when the absolute position of the object being described changes.

It will be understood that when an element such as a layer, film, region, or substrate is referred to as being "on" or "under" another element, it can be "directly on" or "directly under" the other element or intervening elements may be present.

In the description of the above-mentioned embodiments, particular features, structures, materials, or characteristics may be combined in any suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising a display region and a bezel region adjacent to the display region; further comprising:

a partition structure, wherein the partition structure is located in the bezel region; the partition structure comprises multiple partition pillars, the multiple partition pillars comprise first-part partition pillars and second-part partition pillars, the first-part partition pillars are located between the display region and the second-part partition pillars; in a direction perpendicular to a base substrate of the display substrate, a distance between each of the second-part partition pillars and a surface of the base substrate is less than a distance between each of the first-part partition pillars and the surface of the base substrate; and a cathode layer, wherein the cathode layer comprises a portion located in the display region and a portion located in the bezel region, and the cathode layer is partitioned by the partition structure;

wherein the partition pillars have a notch on a side; and wherein the display substrate comprises a second planarization layer and a second passivation layer arranged in a stack, and the second planarization layer is located between the base substrate of the display substrate and the second passivation layer; and the partition pillars are made of the second planarization layer.

2. The display substrate according to claim 1, further comprising: a first planarization layer and a first passivation layer, wherein the first passivation layer is located between the second planarization layer and the base substrate, and the first planarization layer is located between the first passivation layer and the second planarization layer; and the first-part partition pillars are located on a surface of the first planarization layer facing away from the base substrate, and the second-part partition pillars are located on a surface of the first passivation layer facing away from the base substrate.

3. The display substrate according to claim 1, wherein a distance between the adjacent partition pillars in the second-part partition pillars gradually increases, or firstly increases and then decreases along a direction away from the display region;

and/or, wherein a quantity of the partition pillars making up the second-part partition pillars is greater than a quantity of the partition pillars making up the first-part partition pillars.

4. The display substrate according to claim 1, further comprising:

a first planarization layer, wherein the first planarization layer is located between the second planarization layer and the base substrate; and at least one separation groove located in the bezel region, wherein the separation groove penetrates the first planarization layer and the second planarization layer.

5. The display substrate according to claim 4, wherein the display substrate comprises a first separation groove and a second separation groove, and the first separation groove and the second separation groove are sequentially arranged along a direction away from the display region; a width of the first separation groove is less than a width of the second separation groove.

6. The display substrate according to claim 5, wherein the first separation groove, the first-part partition pillars, the second separation groove, and the second-part partition pillars are sequentially arranged along a direction away from the display region.

7. The display substrate according to claim 6, wherein a minimum distance between the second-part partition pillars and the second separation groove is greater than a minimum distance between the first-part partition pillars and the first separation groove.

8. The display substrate according to claim 4, further comprising:

a dam structure, wherein an orthographic projection of the at least one separation groove onto the base substrate is located between an orthographic projection of the dam structure onto the base substrate and the display region.

9. The display substrate according to claim 1, further comprising:

a light-emitting functional layer, wherein the light-emitting functional layer comprises a portion located in the display region and a portion located in the bezel region, and the light-emitting functional layer is partitioned by the partition structure.

10. The display substrate according to claim 1, wherein the partition structure surrounds the display region.

11. The display substrate according to claim 4, wherein the separation groove surrounds the display region.

12. The display substrate according to claim 1, further comprising:

multiple sub-pixels, wherein the multiple sub-pixels are located in the display region, and the sub-pixels each comprise a sub-pixel driving circuit and an anode pattern which are coupled to each other; and multiple gate driving circuits, wherein the gate driving circuits each are coupled to a corresponding sub-pixel driving circuit for providing a scanning signal to the corresponding sub-pixel driving circuit, and an orthographic projection of the gate driving circuit onto the base substrate of the display substrate at least partially overlaps with an orthographic projection of the anode pattern onto the base substrate.

13. The display substrate according to claim 12, wherein the sub-pixel driving circuits comprised by the multiple sub-pixels are distributed in an array, the sub-pixel driving circuits are divided into multiple columns of the sub-pixel driving circuits, the columns being arranged along a first direction, each column of the sub-pixel driving circuits comprises multiple sub-pixel driving circuits arranged along a second direction, and the first direction intersects with the second direction;

the multiple gate driving circuits comprise: multiple light-emitting control driving circuits and multiple scanning control driving circuits; and on a same side of the display substrate, the light-emitting control driving circuits alternate with the scanning control driving circuits along the second direction.

14. The display substrate according to claim 13, wherein the display region comprises a first sub-display area and a second sub-display area, and the gate driving circuits are located in the second sub-display area; and a distance between at least two adjacent columns of the sub-pixel driving circuits in the second sub-display area is less than a distance between two adjacent columns of the sub-pixel driving circuits in the first sub-display area.

15. The display substrate according to claim 14, wherein the second sub-display area comprises three columns of the sub-pixel driving circuits, and a distance between any two adjacent columns of the sub-pixel driving circuits in the second sub-display area is less than a distance between any two adjacent columns of the sub-pixel driving circuits in the first sub-display area.

16. The display substrate according to claim 15, wherein in the first direction, a width of the second sub-display area is substantially the same as a width of a layout region occupied by a repeating unit in the first sub-display area, and the repeating unit comprises three adjacent columns of the sub-pixel driving circuits, and signal lines located on both sides of the three adjacent columns of the sub-pixel driving circuits along the first direction.

17. The display substrate according to claim 14, wherein at least some of widths of layout spaces occupied in the first direction by the sub-pixel driving circuits located in the second sub-display area are less than widths of layout spaces occupied in the first direction by the sub-pixel driving circuits located in the first sub-display area.

18. A display device, comprising a display substrate, wherein the display substrate comprises: a display region and a bezel region adjacent to the display region; and the display substrate further comprises:
- a partition structure, wherein the partition structure is located in the bezel region; the partition structure comprises multiple partition pillars, the multiple partition pillars comprise first-part partition pillars and second-part partition pillars, the first-part partition pillars are located between the display region and the second-part partition pillars; in a direction perpendicular to a base substrate of the display substrate, a distance between each of the second-part partition pillars and a surface of the base substrate is less than a distance between each of the first-part partition pillars and the surface of the base substrate; and
- a cathode layer, wherein the cathode layer comprises a portion located in the display region and a portion located in the bezel region, and the cathode layer is partitioned by the partition structure;

wherein the partition pillars have a notch on a side; and wherein the display substrate comprises a second planarization layer and a second passivation layer arranged in a stack, and the second planarization layer is located between the base substrate of the display substrate and the second passivation layer; and the partition pillars are made of the second planarization layer.

19. A display substrate, comprising a display region and a bezel region adjacent to the display region; further comprising:
- a partition structure, wherein the partition structure is located in the bezel region; the partition structure comprises multiple partition pillars, the multiple partition pillars comprise first-part partition pillars and second-part partition pillars, the first-part partition pillars are located between the display region and the second-part partition pillars; in a direction perpendicular to a base substrate of the display substrate, a distance between each of the second-part partition pillars and a surface of the base substrate is less than a distance between each of the first-part partition pillars and the surface of the base substrate; and
- a cathode layer, wherein the cathode layer comprises a portion located in the display region and a portion located in the bezel region, and the cathode layer is partitioned by the partition structure;

wherein a distance between the adjacent partition pillars in the second-part partition pillars gradually increases, or firstly increases and then decreases along a direction away from the display region;

and/or, wherein a quantity of the partition pillars making up the second-part partition pillars is greater than a quantity of the partition pillars making up the first-part partition pillars.

* * * * *